(12) United States Patent
Zhou et al.

(10) Patent No.: US 10,985,349 B2
(45) Date of Patent: Apr. 20, 2021

(54) HOT-PRESSING BUFFER SUBSTRATE, DISPLAY DEVICE, HOT-PRESSING PROCESS AND METHOD FOR REDUCING X-LINE BRIGHT LINE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiehong Zhou, Beijing (CN); Hengfei Shi, Beijing (CN); Ke Cao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/549,120

(22) Filed: Aug. 23, 2019

(65) Prior Publication Data

US 2020/0185659 A1    Jun. 11, 2020

(30) Foreign Application Priority Data

Dec. 6, 2018    (CN) .......................... 201822042926.3

(51) Int. Cl.
*H01L 51/56*    (2006.01)
*H01L 27/32*    (2006.01)
*H01L 51/52*    (2006.01)

(52) U.S. Cl.
CPC .......... *H01L 51/56* (2013.01); *H01L 27/3244* (2013.01); *H01L 51/529* (2013.01); *H01L 51/5281* (2013.01); *H01L 2227/323* (2013.01)

(58) Field of Classification Search
CPC ... H01L 51/56; H01L 51/5281; H01L 51/529; H01L 27/3244; H01L 2227/323
USPC .......................................................... 257/40
See application file for complete search history.

(56) References Cited

U.S. PATENT DOCUMENTS

| | | | |
|---|---|---|---|
| 2014/0159256 A1* | 6/2014 | Choi | ....................... H01L 24/27 257/783 |
| 2014/0370222 A1* | 12/2014 | Kim | ...................... F28F 21/089 428/40.9 |

FOREIGN PATENT DOCUMENTS

CN       106231865 A    * 12/2016

* cited by examiner

*Primary Examiner* — Tong-Ho Kim
(74) *Attorney, Agent, or Firm* — Brooks Kushman P.C.

(57) ABSTRACT

The present disclosure provides a hot-pressing buffer, a display device, a hot-pressing process, and a method for reducing the X-line bright lines. The hot-pressing buffer includes: a thermally conductive material layer including a non-particulate thermally conductive material made of a non-particulate thermally conductive material; and a buffer material layer wrapped around an outer surface of the non-particulate thermally conductive material layer.

18 Claims, 2 Drawing Sheets

HOT-PRESSING BUFFER SUBSTRATE, DISPLAY DEVICE, HOT-PRESSING PROCESS AND METHOD FOR REDUCING X-LINE BRIGHT LINE

CROSS-REFERENCE TO RELATED APPLICATION

This application claims priority to Chinese Patent Application No. 201822042926.3 filed on Dec. 6, 2018, which is incorporated herein by reference in its entirety.

TECHNICAL FIELD

The present disclosure relates to the field of hot-pressing technology, in particular, to a hot-pressing buffer substrate, a display device, a hot-pressing process, and a method for reducing X-line bright lines.

BACKGROUND

With the development of the display market of active-matrix organic light-emitting diode (AMOLED) and the expansion of the production scale of AMOLED panels, the proportion of AMOLED display panels in the entire display industry is further enhanced. In recent years, AMOLED flexible display has brought a better experience to users. After continuous accumulation, it can be seen that the smart phone market has shown high enthusiasm for AMOLED. Among them, the yield climb of AMOLED has always been a difficult point in the industry.

During the production process of the display, the PAD bonding process is performed, and anisotropic conductive film (ACF) plays a vital role in the PAD bonding process and is used for bonding the circuit board to the display.

The hot-pressing buffer substrate is suitable for the hot-pressing bonding process of various types of display screens (hot-pressing conductive film, flexible circuit board, ITO conductive glass, etc.). During the ACF attaching process, the function of the hot-pressing buffer substrate is to attach the heat-pressing buffer substrate to the bottom surface of the thermode, isolate ACT from directly contacting the thermode, buffer the pressure of the thermode to the ACF, ensure the ACF attaching effect, adjust the crack in the display binding region due to stress concentration, and has a buffering effect on the ACF temperature, so that the temperature is relatively uniform, and at the same time, it has an isolation protection function against static electricity leakage.

The hot-pressing buffer substrate used in ACF attaching of conventional liquid crystal display (LCD) is a layer of silica gel skin wrapped around an outer surface of the thermally conductive medium, in which the thermally conductive medium is aluminum oxide ($Al_2O_3$) particles. Although the silica gel skin is wrapped around the outer surface of the aluminum oxide particles, it is found in the actual production process that the aluminum oxide particles will fall into the bonding region due to the cracking of the silica gel skin, thereby resulting in the breakage of the lead (external terminal) at the corresponding position, and causing the situation of the X-line (X-line means that the signal line in the X direction of the display) bright line. For flexible OLED display, the phenomenon of the X-line bright line resulting from the falling of aluminum oxide particles is particularly serious, which poses higher requirements on the material of the hot-pressing buffer substrate, requires a relatively high consistency of the surface condition of the hot-pressing buffer substrate, and is required to ensure the thermal conductivity, in which the surface state and the thermal conductivity are a bottleneck of the hot-pressing buffer substrate.

SUMMARY

In one aspect, an embodiment of the present disclosure provides a hot-pressing buffer substrate, including: a thermally conductive material layer, comprising a non-particulate thermally conductive material layer made of a non-particulate thermally conductive material; and a buffer material layer wrapped around an outer surface of the non-particulate thermally conductive material layer.

In an example, the thermally conductive material layer includes a graphite layer made of graphite.

In an example, the thermally conductive material layer has a thickness of 0.02 mm to 0.06 mm.

In an example, the thermally conductive material layer has a thickness of 0.04 mm.

In an example, the thermally conductive material layer further comprises a particulate thermally conductive material layer made of a particulate thermally conductive material, wherein the non-particulate thermally conductive material layer is wrapped around an outer surface of the particulate thermally conductive material layer.

In an example, the outer surface of the non-particulate thermally conductive material layer is a planar structure provided with a plurality of hollow structures inside.

In an example, each of the plurality of hollow structures is filled with a particulate thermally conductive material layer.

In an example, the particulate thermally conductive material is an aluminum oxide thermal conductive material.

In an example, the buffer material layer comprises a silica gel layer made of silica gel.

In an example, the silica gel layer has a thickness of is 0.01 mm to 0.03 mm.

In an example, the silica gel layer has a thickness of is 0.02 mm.

In an example, the hot-pressing buffer further comprises an isolation protective layer wrapped around an outer surface of the buffer material layer.

In an example, the isolation protective layer comprises a polyimide film layer.

In an example, the isolation protective layer has a thickness of 0.005 mm to 0.015 mm.

In an example, the isolation protective layer has a thickness of 0.01 mm.

In an example, the hot-pressing buffer is an anisotropic conductive film buffer material.

In another aspect, an embodiment of the present disclosure provides a display device including the above hot-pressing buffer.

In one aspect, an embodiment of the present disclosure provides a hot-pressing process using the above hot-pressing buffer.

An embodiment of the present disclosure further provides a method for reducing X-line bright line in a bonding process of an active matrix organic light-emitting diode (AMOLED), including: plasma cleaning the pad bonding region; and attaching an anisotropic conductive film (ACF), wherein the ACF is placed in the pad bonding region, the ACF is hot-pressed with a thermode, the above hot-pressing buffer is attached to a bottom surface of the thermode to isolate the ACF and the thermode, and temperatures of the thermode and a bearing platform for bearing the pad and the ACF are adjusted according to the actual temperature of the attached ACF to attach the ACF to the pad bonding region.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

To solve the problem in the related art that the particulate thermally conductive material in the hot-pressing buffer, when the outer surface of the silica gel skin is damaged, may contaminate the particulate foreign matter and thus cause the display product to generate an X-line bright line or other undesirable phenomena, an embodiment of the present disclosure provides a hot-pressing buffer, which under the premise of ensuring the thermal conductivity can improve the surface state consistency of the hot-pressing buffer, and solve the problem that the hot-pressing buffer causes the product to generate undesirable problems such as X-line bright lines resulting from the falling of the particulate foreign matter thermally conductive material into pad bonding region during the hot pressing.

As shown in FIGS. 1 to 4, the hot-pressing buffer provided by the embodiment of the present disclosure includes: a thermally conductive material layer, comprising a non-particulate thermally conductive material layer 100 made of a non-particulate thermally conductive material; and a buffer material layer 200 wrapped around an outer surface of the non-particulate thermally conductive material layer 100.

The hot-pressing buffer provided in the above solution is characterized in that the buffer material layer 200 is wrapped around the other surface of the non-particulate thermally conductive material, and the non-particulate thermally conductive material is used to replace the particulate thermally conductive material in the related art. At the same time that the thermal conductivity can be ensured, the surface state consistency of the hot-pressing buffer is improved, so that the buffer material layer 200 is not easily broken. Even if the buffer material layer 200 is broken, the particulate foreign matter will not fall, thereby avoiding the contamination of the particulate foreign matter to the pad bonding region caused by the buffer material layer 200, and thus reducing the resulting X-line bright lines and other undesirable phenomena.

Figure 1:
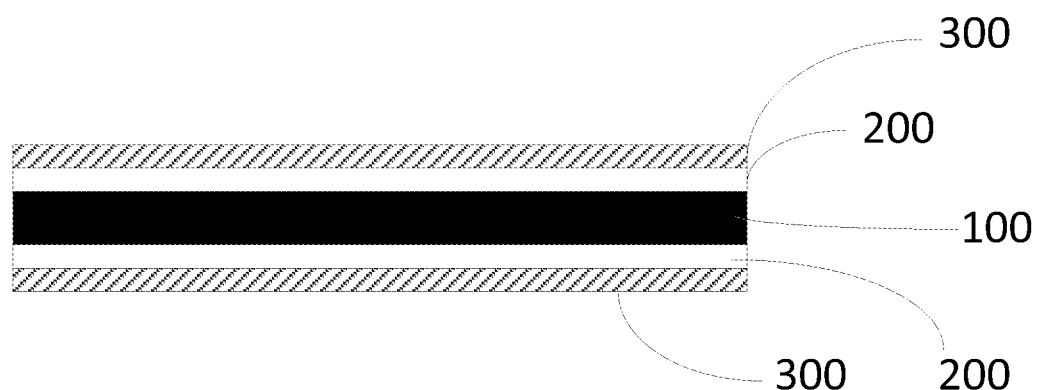
FIG. 1 is a schematic view showing a hot-pressing buffer provided in a first exemplary embodiment of the present disclosure.

In an exemplary embodiment provided by the present disclosure, as shown in FIG. 1, the non-particulate thermally conductive material layer 100 includes a graphite layer made of graphite.

According to the above solution, the non-particulate thermally conductive material is graphite, which can meet the thermal conductivity requirement on the one hand, and can improve the surface state of the hot-pressing buffer on the other hand, and can simultaneously ensure the influence of the thermal conductivity and surface state of the hot-pressing buffer on process yield.

It should be noted that the non-particulate thermally conductive material selected from graphite only provides an alternative. In practical applications, the non-particulate thermally conductive material layer 100 may also be formed with other non-particulate thermally conductive materials and not limited to this.

In addition, it should be noted that the non-particulate thermally conductive material layer 100 may be formed with graphite to form a graphite layer, or may be formed with a plurality of non-particulate thermally conductive materials.

Figure 2:
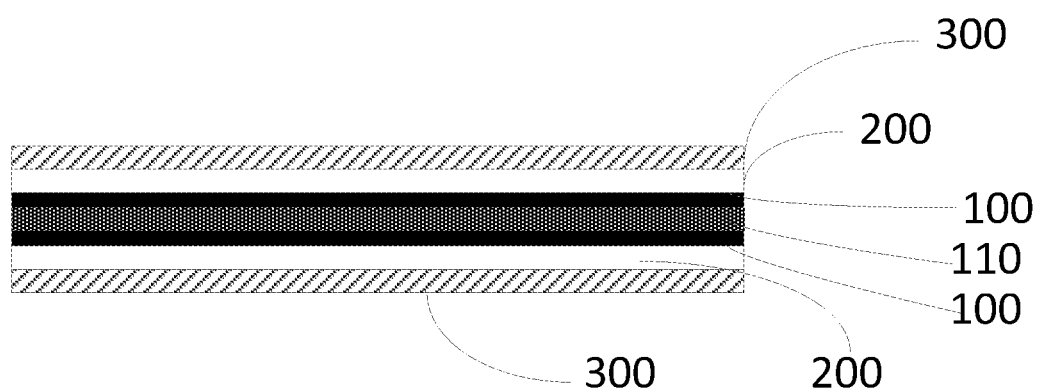
FIG. 2 is a schematic view showing a hot-pressing buffer provided in a second exemplary embodiment of the present disclosure.

In addition, the thermally conductive material layer may be a whole graphite layer formed with graphite alone (as shown in FIG. 1), or may be a multilayer structure including a graphite layer, or may be made with a non-particulate thermally conductive material and a particulate thermally conductive material, for example:

In an exemplary embodiment, as shown in FIG. 2, the thermally conductive material layer may include a non-particulate thermally conductive material layer 100 made of a non-particulate thermally conductive material, and may further includes a thermally conductive material layer 110 made of a particulate thermally conductive material, in which the non-particulate thermally conductive material layer 100 is wrapped around an outer surface of the particulate thermally conductive material layer 110.

In the above solution, the thermally conductive material layer is made of a non-particulate thermally conductive material and a particulate thermally conductive material, in which the non-particulate thermally conductive material layer 100 is a layered structure, and the particulate thermally conductive material layer 110 is a layered structure, and the non-particulate thermally conductive material layer 100 is wrapped around the outer surface of the particulate thermally conductive material layer 110. Thus, the surface flatness of the entire thermally conductive material layer can be ensured, so that the buffer material layer 200 is not easily broken. Even if the buffer material layer 200 is broken, there is no falling of particulate foreign matters, thereby avoiding the particulate foreign matters caused by the damage of the buffer material layer 200 to contaminate the pad bonding region, and reducing the undesirable phenomena such as the X-line bright line.

In the exemplary embodiment, the particulate thermally conductive material may be a particulate thermally conductive material such as a thermal conductive material of aluminum oxide, and the non-particulate thermally conductive material layer may be a non-particulate thermally conductive material of graphite or the like.

Figure 3:
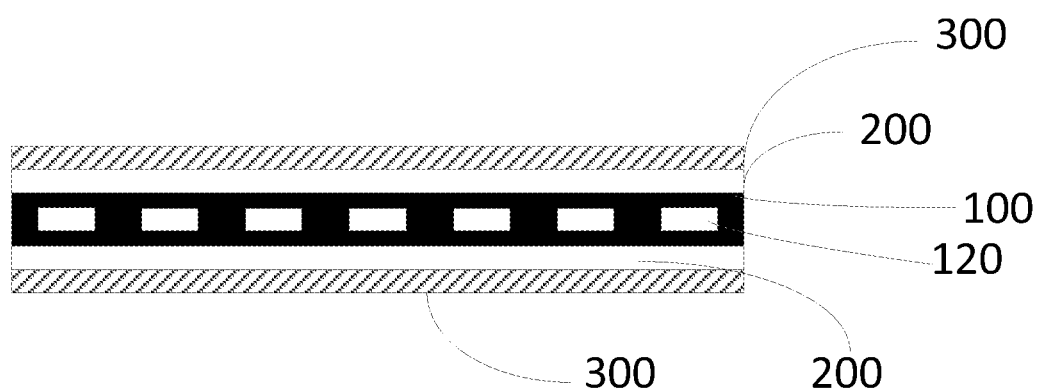
FIG. 3 is a schematic view showing a hot-pressing buffer provided in a third exemplary embodiment of the present disclosure.

In an example, in another exemplary embodiment of the present disclosure, as shown in FIG. 3, the outer surface of the non-particulate thermally conductive material layer 100 is a planar structure provided with a plurality of hollow structures 120 inside.

With the above solution, the outer surface of the non-particulate thermally conductive material layer 100 has a planar structure, which can ensure the surface flatness of the entire thermally conductive material layer, so that the buffer material layer 200 is not easily broken. Moreover, according to the requirements for conditions such as the thermal conductivity of the thermally conductive material in practical applications, the non-particulate thermally conductive material layer 110 inside is provided with a hollow structure 120.

Figure 4:
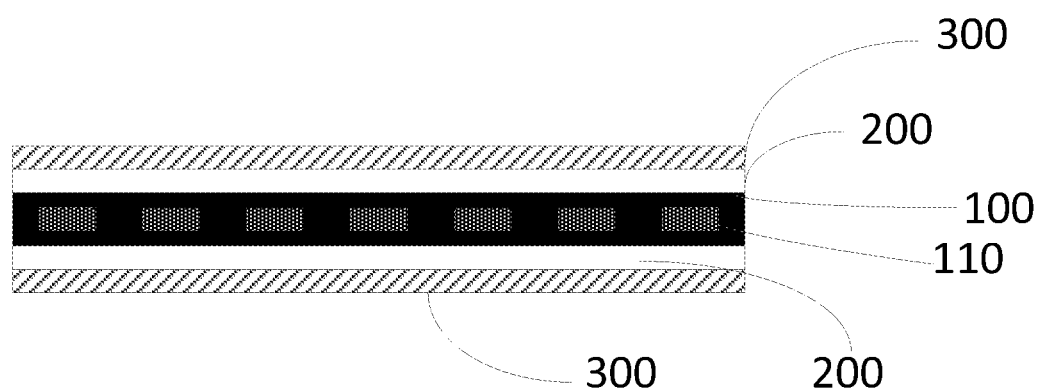
FIG. 4 is a schematic view showing a hot-pressing buffer provided in a fourth exemplary embodiment of the present disclosure.

In an exemplary embodiment, as shown in FIG. 4, the hollow structure 120 may be filled with a particulate thermally conductive material layer 110.

According to the above solution, the thermally conductive material layer may be made of a non-particulate thermally conductive material and a particulate thermally conductive material, in which the non-particulate thermally conductive material layer 100 can ensure the surface flatness of the entire thermally conductive material layer; and the non-particulate thermally conductive material layer provided with a plurality of hollow structures inside is filled with a particulate thermally conductive material. A suitable particulate thermally conductive material can be selected according to requirements for conditions such as thermal conductivity in practical applications.

For example, the non-particulate thermally conductive material may be a graphite, and the particulate thermally conductive material may be a thermal conductive material of aluminum oxide.

In addition, in the embodiment provided by the present disclosure, optionally, the thermally conductive material layer 100 has a thickness of 0.02 mm to 0.06 mm.

According to the above solution, when the thickness of the thermally conductive material layer 100 is 0.02 mm to 0.06 mm, the thermally conductive efficiency of the hot-pressing buffer is better. Optionally, when the thickness of the thermally conductive material layer 100 is 0.04 mm, the thermally conductive efficiency and the surface state uniformity of the hot-pressing buffer are better.

In an example, in the embodiment provided by the present disclosure, exemplarily, the buffer material layer 200 includes a silica gel layer made of silica gel.

According to the above solution, the buffer material layer 200 is made of silica gel, and the silica gel has the advantages of smooth surface, uniform thickness, and excellent performances, such as ductility, rebound resistance and deformation resistance. It should be understood that, in practical applications, the buffer material layer 200 may be also other materials having a rebound deformation buffer function, such as rubber, which is not limited herein.

In an example, in the embodiment provided by the present disclosure, optionally, the silica gel layer has a thickness of 0.02 mm.

According to the above solution, when the thickness of the silica gel layer is 0.01 mm to 0.03 mm, the hot-pressing buffer has better thermal conductivity and surface state. Optionally, when the thickness of the silica gel layer is 0.02 mm, the hot-pressing buffer has better thermal conductivity and surface state.

Moreover, in the embodiments provided by the present disclosure, exemplary, the hot-pressing buffer further includes an isolation protective layer 300 wrapped around the out surface of the buffer material layer 200.

With the above solution, by adding one isolation protective layer 300 on the outer surface of the buffer material layer 200, the inner layer structures (the buffer material layer 200 and the thermally conductive material layer 100) are isolated and protected, and the surface flatness of the hot-pressing buffer can be further improved, thereby increasing the adhesion flatness of the AFC for the hot pressing.

Illustratively, the isolation protective layer 300 includes a polyimide (PI) film layer.

In the above exemplary embodiment, the isolation protective layer 300 may be formed with polyimide (PI), which is one of the organic polymer materials with better comprehensive performance, and has high temperature resistance and high insulation performances, thereby providing effective isolative protection. It should be understood that, in practical applications, the isolation protective layer 300 may also be made of other materials.

Optionally, the isolation protective layer 300 has a thickness of 0.005 mm to 0.015 mm.

According to the above solution, when the isolation protective layer 300 has a thickness of 0.005 mm to 0.015 mm, the performance of the hot-pressing buffer is better, and the influence of the thermal conductivity and the surface state consistency on the process yield can be ensured. Optionally, when the isolation protective layer 300 has a thickness of 0.01 mm, the performance of the hot-pressing buffer is better.

In addition, it should be noted that the hot-pressing buffer provided by the embodiments of the present disclosure can be used as an anisotropic conductive film buffer material, for attaching isotropic conductive film (ACF) to the pad bonding region; and it can also be used as a hot-pressing attachment for other products.

When the hot-pressing buffer is applied in the pad bonding region to attach the ACF by hot-pressing, first, plasma cleaning the pad bonding region; and then attaching the ACF according to the normal ACF attaching process, in which the ACF is placed in the pad bonding region, the ACF is hot-pressed with a thermode, the hot-pressing buffer is attached to a bottom surface of the thermode to isolate the ACF and the thermode, and temperatures of the thermode and a bearing platform for bearing the pad and the ACF are adjusted according to the actual temperature of the attached ACF to attach the ACF to the pad bonding region.

As compared with articulate thermally conductive material used in the related art, the hot-pressing buffer provided by the present disclosure with a buffer material layer wrapped around the outer surface of the non-particulate thermally conductive material can improve the surface state consistency of hot-pressuring buffer material, and avoid the contamination of the particulate thermally conductive material to the pad bonding region due to the breakage of the buffer material layer while maintaining the thermal conductivity, thereby reducing the X-line bright line and the like.

With the hot-pressing buffer of the present disclosure instead of the conventional ACF buffer material, the defect rate of X-line bright line is reduced from 4500 ppm to 150 ppm when the ACF is hot-pressed in the pad bonding region.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:
1. A hot-pressing buffer comprising:
   a thermally conductive material layer, comprising a non-particulate thermally conductive material layer made of a non-particulate thermally conductive material; and
   a buffer material layer wrapped around an outer surface of the non-particulate thermally conductive material layer, wherein the thermally conductive material layer further comprises a particulate thermally conductive material layer made of a particulate thermally conductive material, wherein the non-particulate thermally conductive material layer is wrapped around an outer surface of the particulate thermally conductive material layer.

2. The hot-pressing buffer of claim 1, wherein the non-particulate thermally conductive material layer comprises a graphite layer made of graphite.

3. The hot-pressing buffer of claim 2, wherein the thermally conductive material layer has a thickness of 0.02 mm to 0.06 mm.

4. The hot-pressing buffer of claim 3, wherein the thermally conductive material layer has a thickness of 0.04 mm.

5. The hot-pressing buffer of claim 1, wherein the particulate thermally conductive material is an aluminum oxide thermal conductive material.

6. The hot-pressing buffer of claim 1, wherein the buffer material layer comprises a silica gel layer made of silica gel.

7. The hot-pressing buffer of claim 6, wherein the silica gel layer has a thickness of is 0.01 mm to 0.03 mm.

8. The hot-pressing buffer of claim 7, wherein the silica gel layer has a thickness of 0.02 mm.

9. The hot-pressing buffer of claim 1, further comprising an isolation protective layer wrapped around an outer surface of the buffer material layer.

10. The hot-pressing buffer of claim 9, wherein the isolation protective layer comprises a polyimide film layer.

11. The hot-pressing buffer of claim 10, wherein the isolation protective layer has a thickness of 0.005 mm to 0.015 mm.

12. The hot-pressing buffer of claim 11, wherein the isolation protective layer has a thickness of 0.01 mm.

13. The hot-pressing buffer of claim 1, wherein the hot-pressing buffer is an anisotropic conductive film buffer material.

14. A display device comprising the hot-pressing buffer of claim 1.

15. A hot-pressing process using the hot-pressing buffer of claim 1.

16. A method for reducing X-line bright line in a bonding process of an active matrix organic light-emitting diode (AMOLED), comprising:
plasma cleaning a flexible OLED pad bonding region; and
attaching an anisotropic conductive film (ACF), wherein the ACF is placed in the pad bonding region, the ACF is hot-pressed with a thermode, the hot-pressing buffer of claim 1 is attached to a bottom surface of the thermode to isolate the ACF and the thermode, and temperatures of the thermode and a bearing platform for bearing the pad and the ACF are adjusted according to the actual temperature of the attached ACF to attach the ACF to the pad bonding region.

17. A hot-pressing buffer comprising:
a thermally conductive material layer, comprising a non-particulate thermally conductive material layer made of a non-particulate thermally conductive material; and
a buffer material layer wrapped around an outer surface of the non-particulate thermally conductive material layer,
wherein the outer surface of the non-particulate thermally conductive material layer is a planar structure provided with a plurality of hollow structures inside.

18. The hot-pressing buffer of claim 17, wherein each of the plurality of hollow structures is filled with a particulate thermally conductive material layer.

* * * * *